(12) United States Patent
Wuu et al.

(10) Patent No.: US 7,511,307 B2
(45) Date of Patent: Mar. 31, 2009

(54) LIGHT EMITTING DEVICE

(75) Inventors: Dong-Sing Wuu, No. 50, Alley 30, Lane 107, Mei-Tsun S. Rd., Nan Dist., Taichung City (TW); Ray-Hua Horng, Taichung (TW); Woei-Kai Wang, Taichung (TW); Kuo-Sheng Wen, Taichung (TW)

(73) Assignee: Dong-Sing Wuu, Taichung (TW)

( * ) Notice: Subject to any disclaimer, the term of this patent is extended or adjusted under 35 U.S.C. 154(b) by 167 days.

(21) Appl. No.: 11/488,012

(22) Filed: Jul. 18, 2006

(65) Prior Publication Data

US 2007/0206130 A1   Sep. 6, 2007

(30) Foreign Application Priority Data

Mar. 2, 2006   (TW) ............................ 95106964 A

(51) Int. Cl.
*H01L 27/15* (2006.01)
*H01L 33/00* (2006.01)
(52) U.S. Cl. ............. 257/79; 257/98; 257/E33.033
(58) Field of Classification Search ............. 257/98, 257/E33.003; *H01L 33/00*
See application file for complete search history.

(56) References Cited

U.S. PATENT DOCUMENTS

2004/0113166 A1* 6/2004 Tadatomo et al. ............. 257/98
2005/0285136 A1* 12/2005 Ou et al. ..................... 257/103

FOREIGN PATENT DOCUMENTS

TW           1236773          7/2005

* cited by examiner

*Primary Examiner*—Lex Malsawma
(74) *Attorney, Agent, or Firm*—Davidson Berquist Jackson & Gowdey, LLP

(57) ABSTRACT

A light emitting device includes: a light-enhancing layered structure of a hexagonal crystal system, the light-enhancing layered structure including a light-enhancing layer having a planar surface that is formed with a plurality of light-enhancing units thereon, each of the light-enhancing units extending in a normal direction relative to the planar surface, being tapered from the planar surface, and having three inclined faces that are adjoined side-by-side and that are respectively parallel to corresponding symmetrical ones of the crystal planes $\{11\overline{2}\overline{k}\}$ of the hexagonal crystal system, where $\overline{k}=2$ to 5; and a light emitting layered structure formed on the light-enhancing layered structure.

8 Claims, 13 Drawing Sheets ent of the light emitting device according to this invention;
FIG. 7 is a schematic side view of the fourth preferred embodiment of the light emitting device according to this invention;
FIG. 8 is a schematic view of the fifth preferred embodiment of the light emitting device according to this invention;
FIG. 9 is a schematic view of the sixth preferred embodiment of the light emitting device according to this invention;
FIG. 10 is a schematic top view to illustrate the configuration of protrusions of a light-enhancing layered structure of the sixth preferred embodiment;
FIG. 11 is a schematic top view of the seventh preferred embodiment of the light emitting device according to this invention;
FIG. 12 is a schematic view of the eighth preferred embodiment of the light emitting device according to this invention; and
FIG. 13 is a plot of light extraction efficiency for the aforesaid conventional light emitting device and the first preferred embodiment of the light emitting device of this invention.

LIGHT EMITTING DEVICE

CROSS-REFERENCE TO RELATED APPLICATION

This application claims priority of Taiwanese Application No. 095106964, filed on Mar. 2, 2006.

BACKGROUND OF THE INVENTION

1. Field of the Invention

This invention relates to a light emitting device, more particularly to a highly efficient light emitting device including a light-enhancing layered structure having three inclined faces that are respectively parallel to corresponding symmetrical ones of the crystal planes $\{11\bar{2}\bar{k}\}$ of the hexagonal crystal system.

2. Description of the Related Art

Taiwanese patent no. 1236773 discloses a conventional highly efficient light emitting device that can improve its light extraction efficiency by forming a plurality of recesses in a sapphire substrate. The recesses serve to increase internal reflection of light emitted by a light emitting layered structure formed on the sapphire substrate, and are formed using dry etching techniques.

SUMMARY OF THE INVENTION

The object of the present invention is to provide a light emitting device that is capable of further enhancing light extraction efficiency as compared to the conventional light emitting devices.

According to this invention, there is provided a light emitting device that comprises: a light-enhancing layered structure of a hexagonal crystal system, the light-enhancing layered structure including a light-enhancing layer having a planar surface that is formed with a plurality of light-enhancing units thereon, each of the light-enhancing units extending in a normal direction relative to the planar surface, being tapered from the planar surface, and having three inclined faces that are adjoined side-by-side and that are respectively parallel to corresponding symmetrical ones of the crystal planes $\{11\bar{2}\bar{k}\}$ of the hexagonal crystal system, where $\bar{k}=2$ to 5; and a light emitting layered structure formed on the light-enhancing layered structure.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 1:
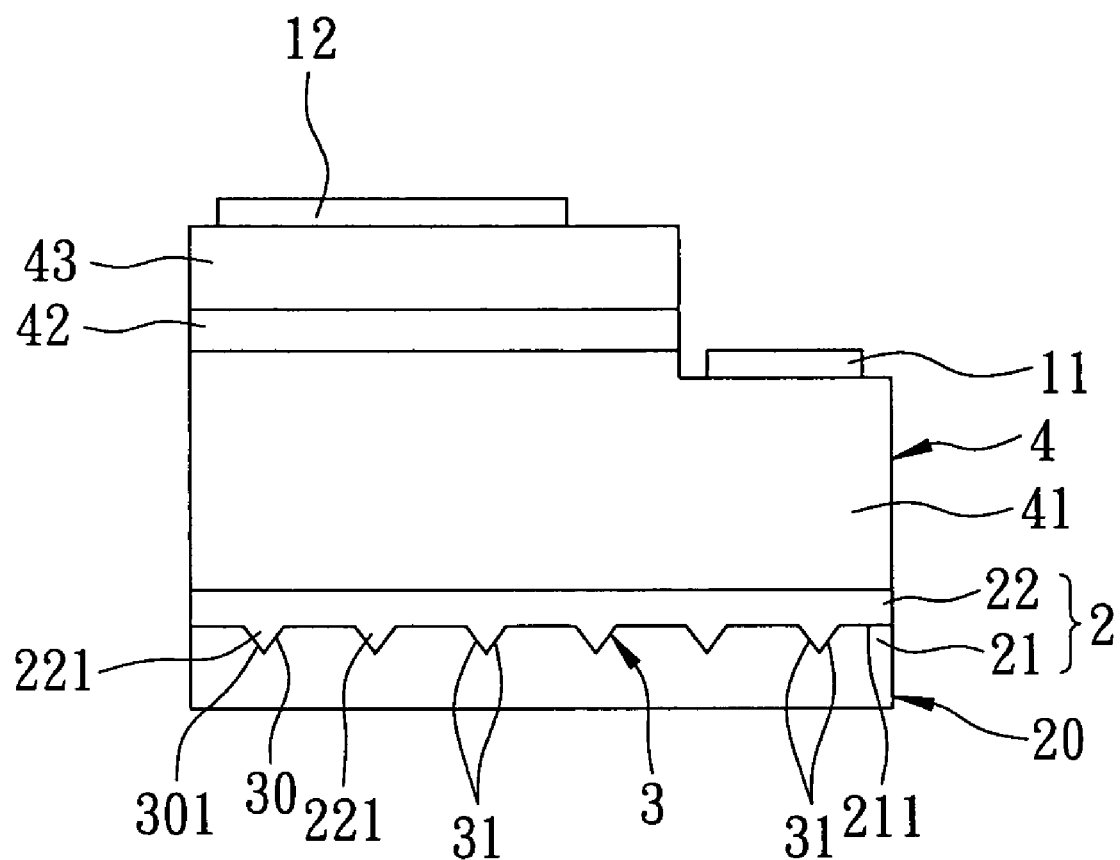
FIG. 1 is a schematic view of the first preferred embodiment of a light emitting device according to this invention.

Before the present invention is described in greater detail, it should be noted that same reference numerals have been used to denote like elements throughout the specification.

Figure 2:
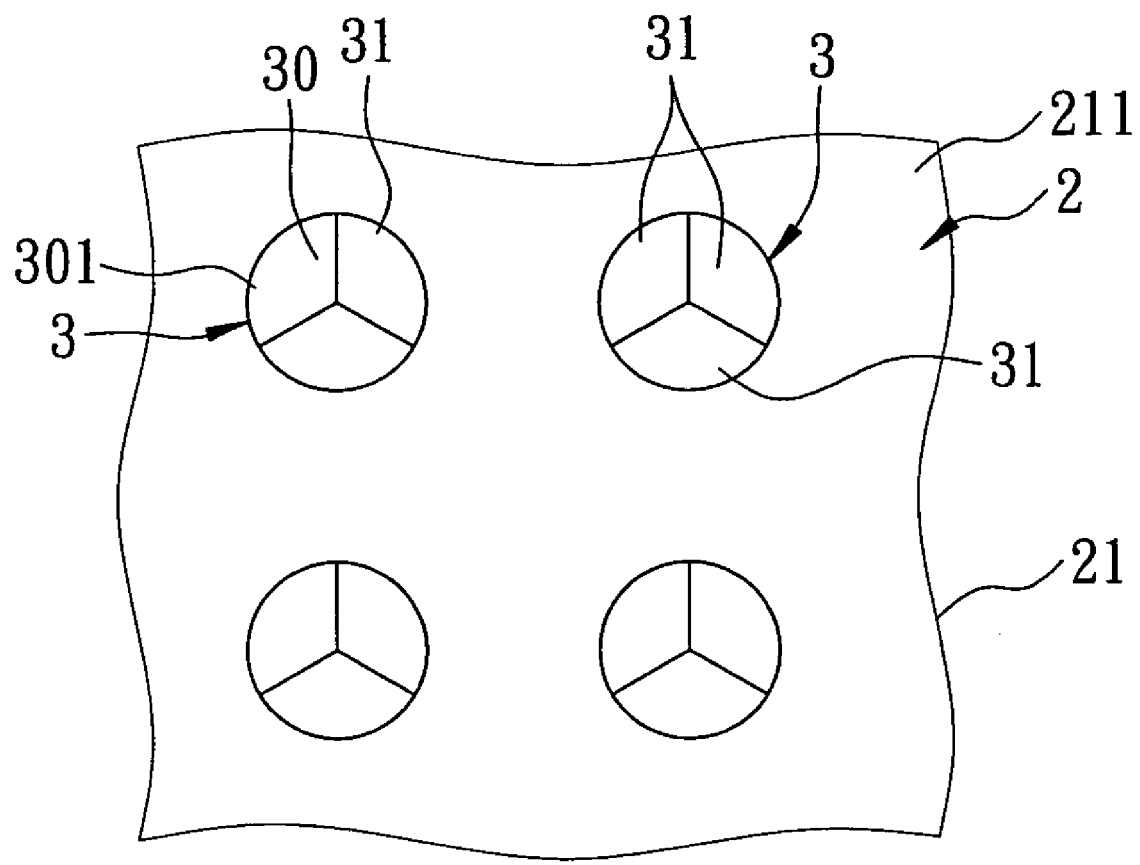
FIG. 2 is a schematic top view to illustrate the pattern of recesses formed in a light-enhancing layered structure of the first preferred embodiment.
Figure 3:
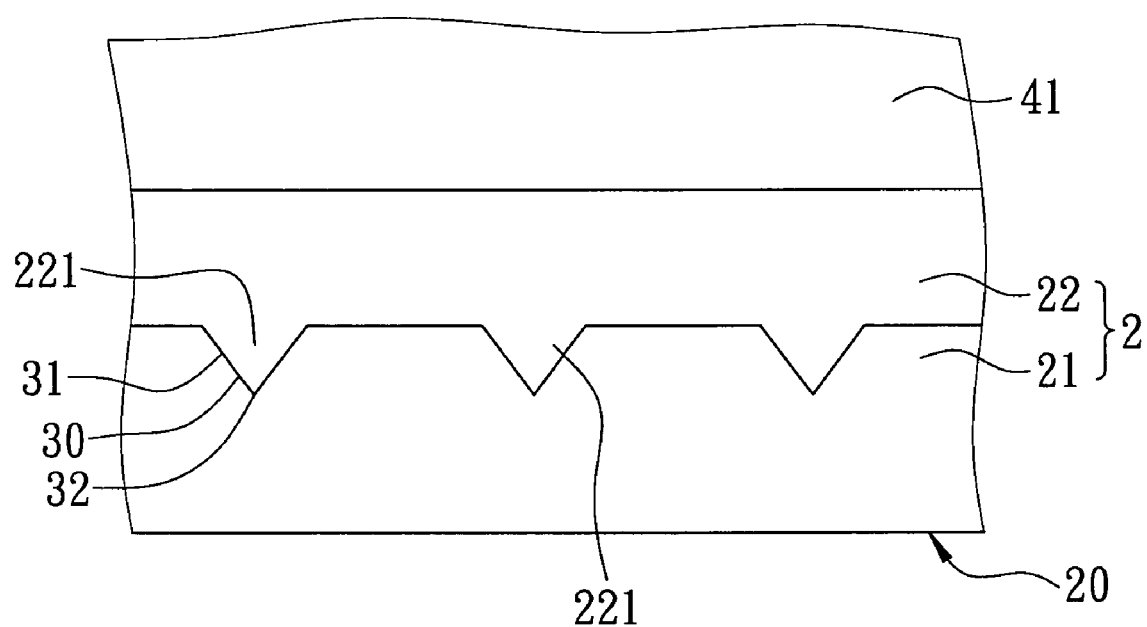
FIG. 3 is a schematic side view to illustrate the configuration of the recesses in the light-enhancing layered structure of the first preferred embodiment.

FIGS. 1 to 3 illustrate the first preferred embodiment of a light emitting device according to this invention. The light emitting device includes: a light-enhancing layered structure 2 of a hexagonal crystal system, the light-enhancing layered structure 2 including a light-enhancing layer 21 having a planar surface 211 that is formed with a plurality of light-enhancing units 3 thereon, each of the light-enhancing units 3 extending in a normal direction relative to the planar surface 211, being tapered from the planar surface 211, and having three inclined faces 31 that are adjoined side-by-side and that are respectively parallel to corresponding symmetrical ones of the crystal planes $\{11\bar{2}\bar{k}\}$ of the hexagonal crystal system (the integers in the parentheses are the Miller indices of the crystal planes), where $\bar{k}=2$ to 5; and a light emitting layered structure 4 formed on the light-enhancing layered structure 2. The group of the crystal planes $\{11\bar{2}\bar{k}\}$ are $(11\bar{2}k)$, $(1\bar{2}1k)$, $(\bar{2}11k)$, $(2\bar{1}\bar{1}k)$, $(\bar{1}\bar{1}2k)$, and $(\bar{1}2\bar{1}k)$.

Among them, the subgroup of the crystal planes $(11\bar{2}k)$, $(1\bar{2}1k)$, and $(\bar{2}11k)$ are symmetrical and are formed into an inverted pyramid, while the subgroup of the crystal planes $(2\bar{1}\bar{1}k)$, $(\bar{1}\bar{1}2k)$, and $(\bar{1}2\bar{1}k)$ are symmetrical and are formed into another inverted pyramid. The inclined faces 31 are respectively parallel to the subgroup of the crystal planes $(11\bar{2}k)$, $(1\bar{2}1k)$, and $(\bar{2}11k)$, or the other subgroup of the crystal planes $(2\bar{1}\bar{1}k)$, $(\bar{1}\bar{1}2k)$, and $(\bar{1}2\bar{1}k)$.

In this embodiment, each of the light-enhancing units 3 is in the form of a recessed wall that defines a recess 30 indented inwardly from the planar surface 211 of the light-enhancing layer 21, and that has a peripheral wall portion 301 defining the inclined faces 31. Formation of the light-enhancing units 3 on the light-enhancing layer 21 enhances the total internal reflection of light emitted from the light emitting layered structure 4 inside the light emitting device, which results in an increase in the light extraction efficiency of the light emitting device. In this embodiment, the light-enhancing layer 21 is defined by wet etching an upper portion of a sapphire substrate 20 to form the recesses 30. The light-enhancing layer 21 thus formed has a layer thickness proximate to the depth of the recesses 30. By controlling the operating conditions of the wet etching, the desired aspect ratio (height to width) of the recesses 30 and the desired k value of the crystal planes $\{11\bar{2}\bar{k}\}$ can be achieved.

The light-enhancing layered structure 2 further includes a buffer layer 22 of a hexagonal crystal system formed on the planar surface 211 of the light-enhancing layer 21 and formed with a plurality of protrusions 221 extending respectively into the recesses 30 of the light-enhancing units 3.

The light emitting layered structure 4 includes a first type cladding layer 41 formed on the buffer layer 22, an active layer 42 of a multi-quantum well (MQW) formed on the first type cladding layer 41, and a second type cladding layer 43 formed on the active layer 42. First and second electrodes 11, 12 are respectively formed on the first type and the second type cladding layers 41, 43.

In this embodiment, each of the protrusions 221 fills completely the respective one of the recesses 30. The recessed wall of each of the light-enhancing units 3 further has a tip end 32 (see FIG. 3). The recess 30 has a depth ranging from 0.3 to 5 μm relative to the planar surface 211 of the light-enhancing layer 21.

Figure 4:
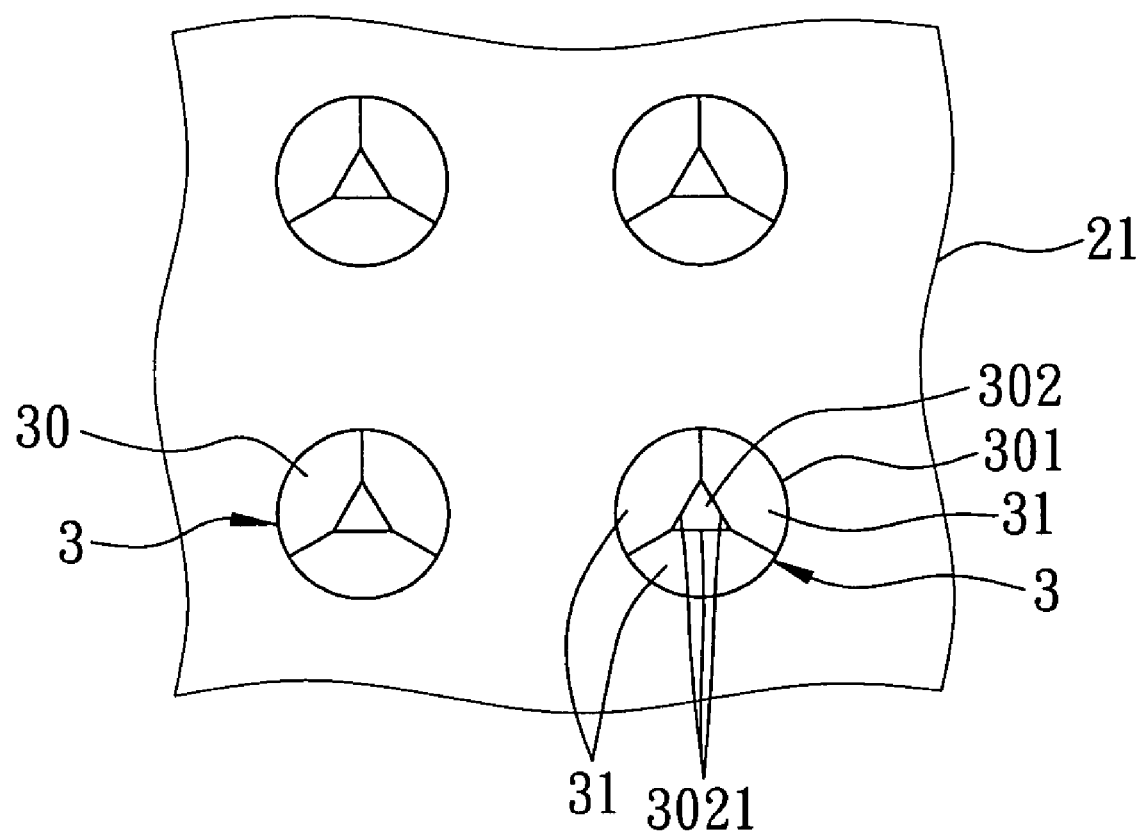
FIG. 4 is a schematic top view of the second preferred embodiment of the light emitting device according to this invention.
Figure 5:
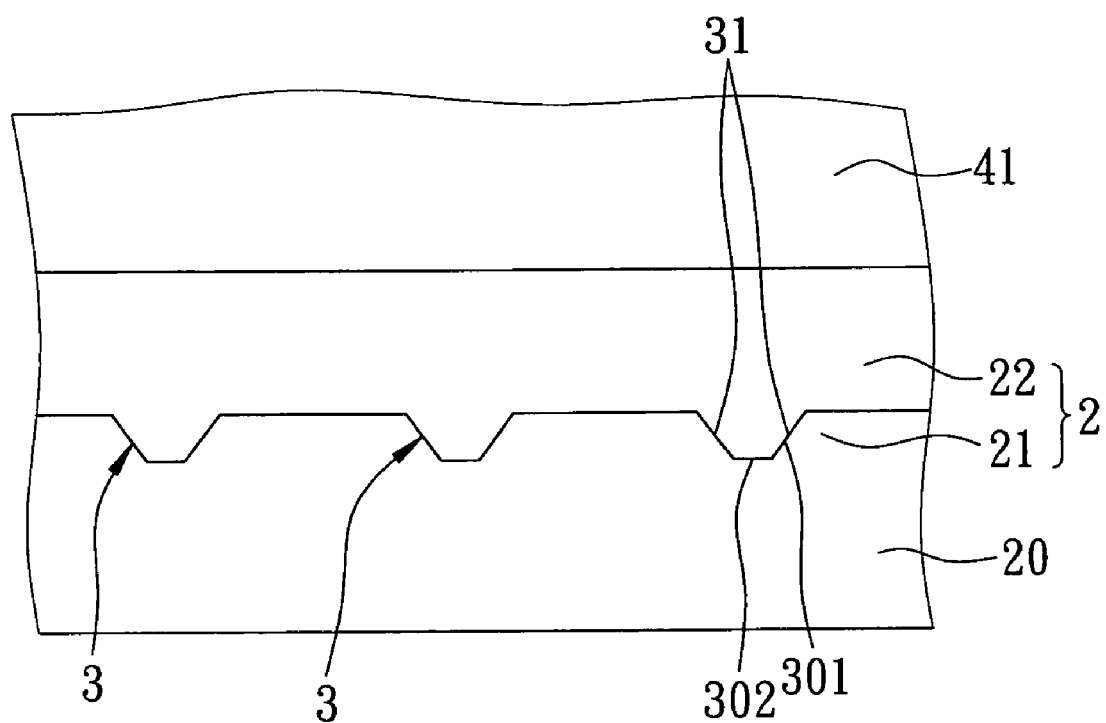
FIG. 5 is a schematic side view of the second preferred embodiment of the light emitting device according to this invention.

FIGS. 4 and 5 illustrate the second preferred embodiment of the light emitting device according to this invention. The light emitting device of the second preferred embodiment differs from the previous embodiment in that the recessed wall of each of the light-enhancing units 3 further has a base wall portion 302 that is triangular in shape, and that has three edges 3021 connected respectively to edges of the inclined faces 31.

Figure 6:
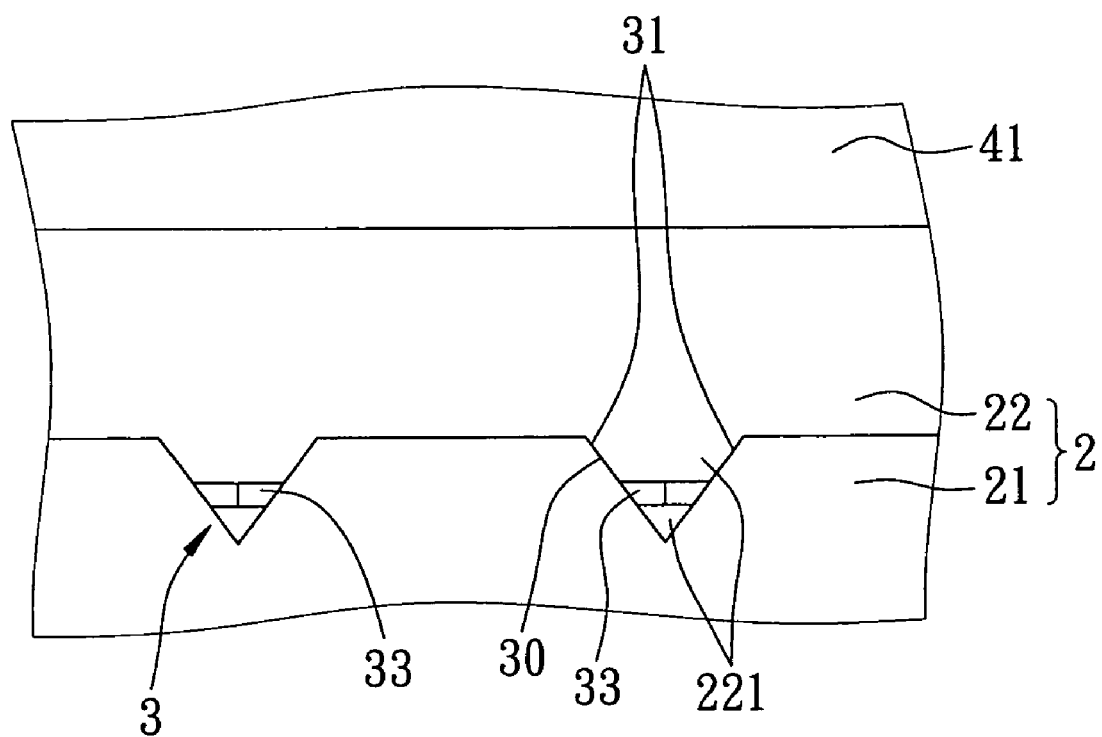

FIG. 6 illustrates the third preferred embodiment of the light emitting device according to this invention. The light emitting device of the third preferred embodiment differs from the first preferred embodiment in that each of the protrusions 221 of the buffer layer 22 intersects the inclined faces 31 of the recessed wall of the respective one of the light-enhancing units 3 so as to form closed cavities 33 therebetween.

Figure 7:
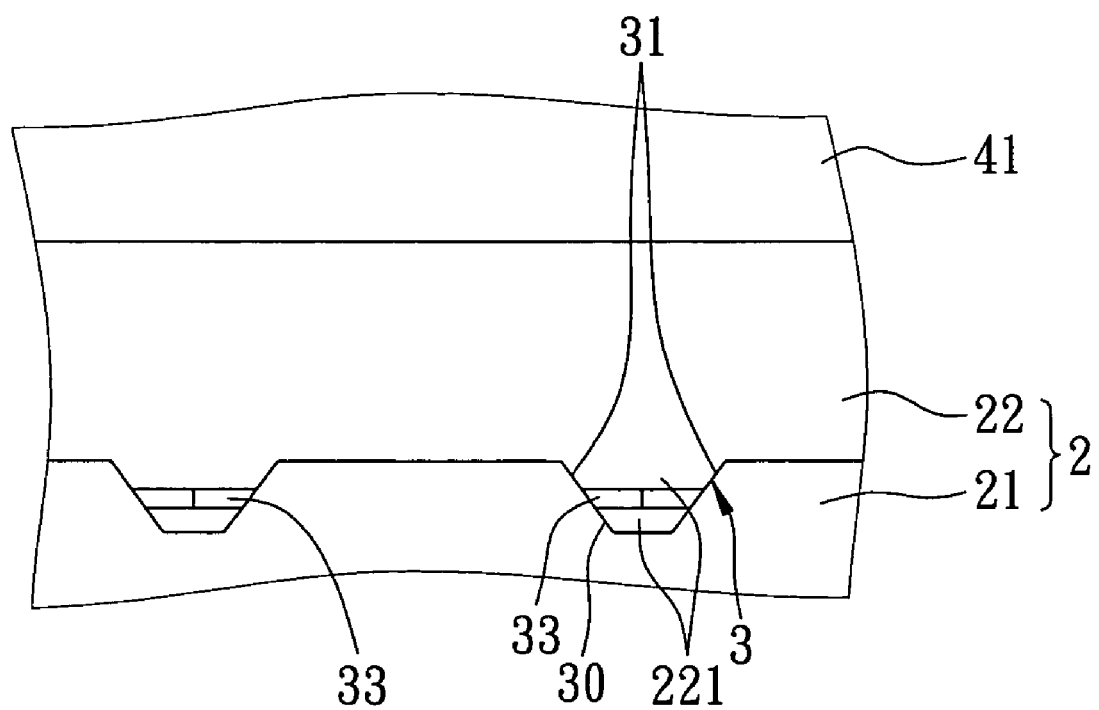

FIG. 7 illustrates the fourth preferred embodiment of the light emitting device according to this invention. The light emitting device of the fourth preferred embodiment differs from the second preferred embodiment in that each of the protrusions 221 of the buffer layer 22 intersects the inclined faces 31 of the recessed wall of the respective one of the light-enhancing units 3 so as to form closed cavities 33 therebetween.

Figure 8:
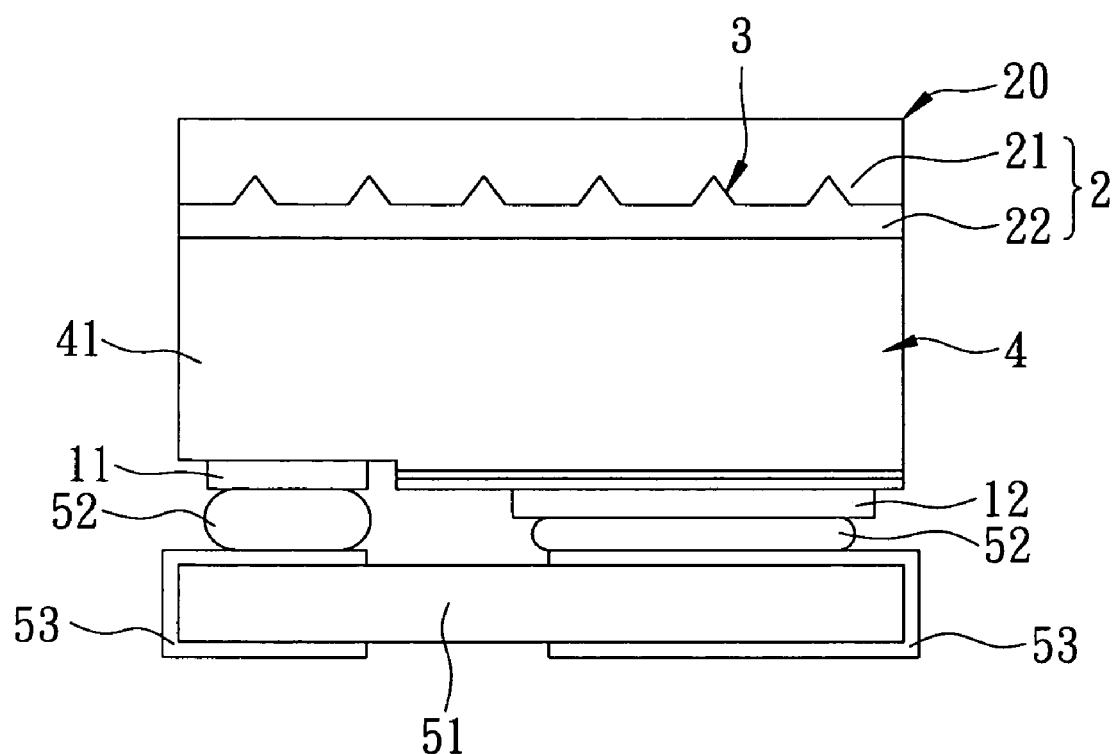

FIG. 8 illustrates the fifth preferred embodiment of the light emitting device according to this invention. The light emitting device of the fifth preferred embodiment differs from the first preferred embodiment in that the light emitting device is in the form of a flip chip, and further includes a heat dissipating member 51 with two spaced apart conductive members 53 connected to the first and second electrodes 11, 12 through solder pads 52.

Figure 9:
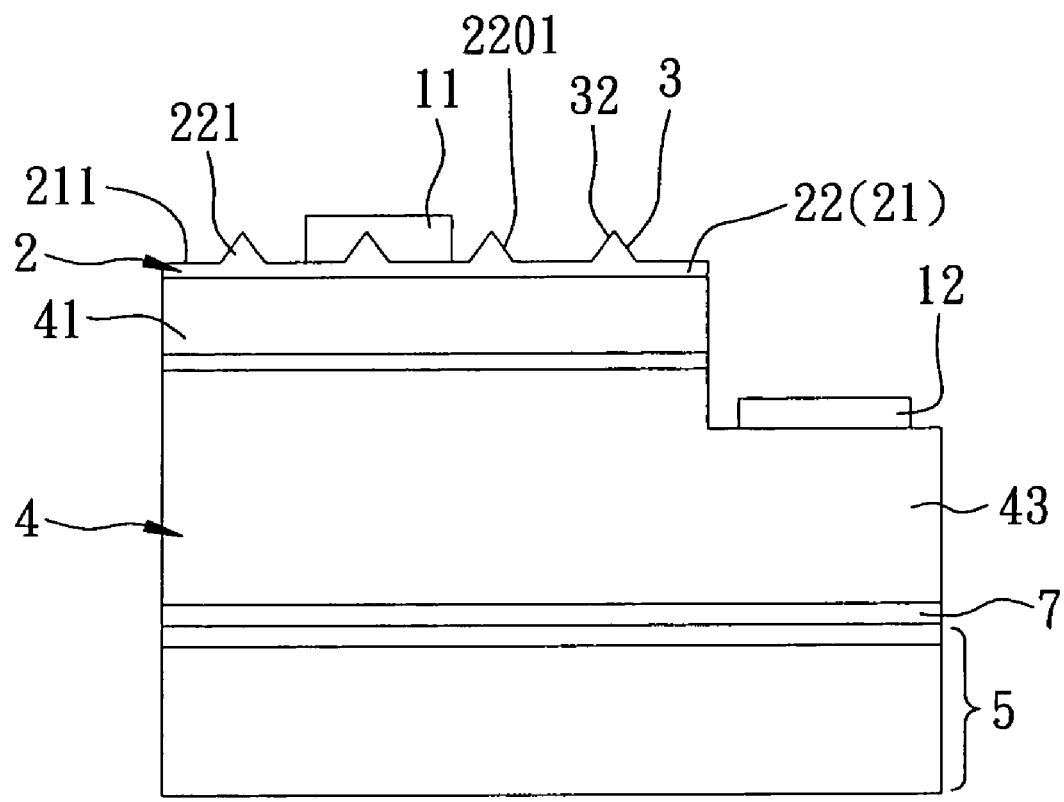
Figure 10:
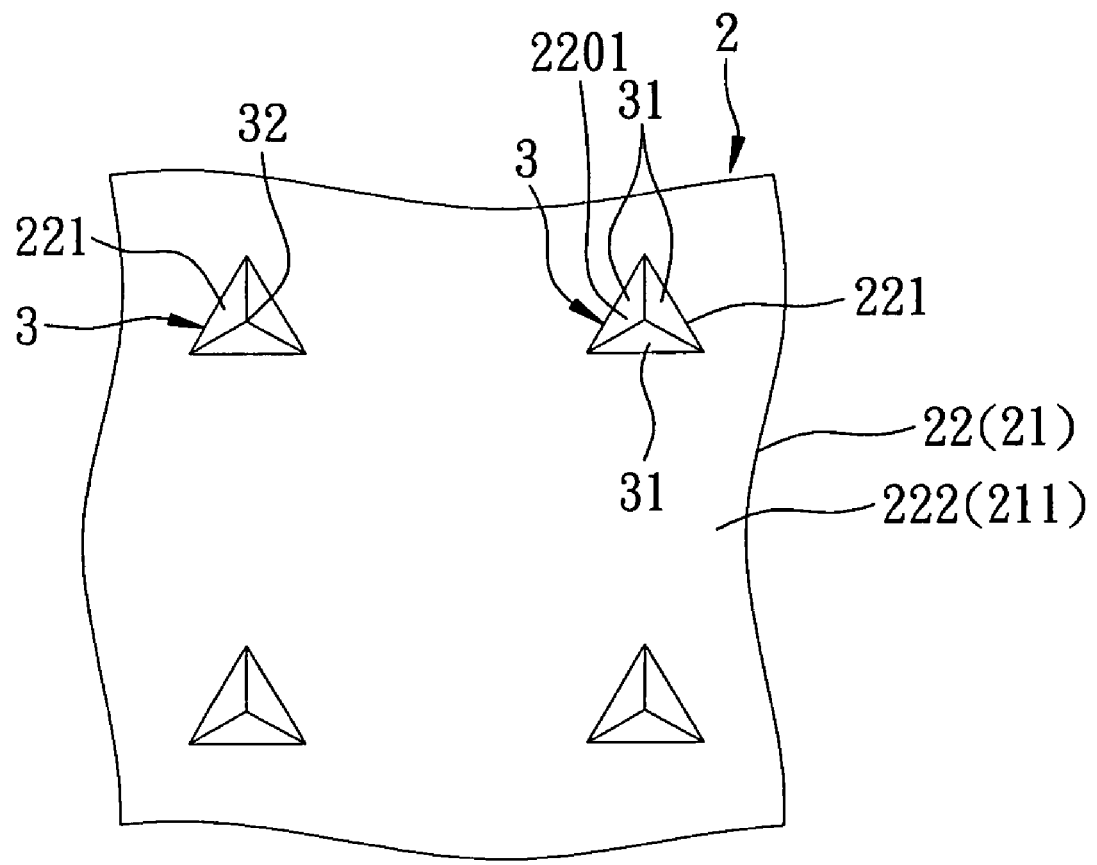

FIGS. 9 and 10 illustrate the sixth preferred embodiment of the light emitting device according to this invention. The light emitting device of the sixth preferred embodiment is formed by forming the assembly of the light-enhancing layered structure 2 and the light emitting layered structure 4, thereafter forming a metal light-enhancing layer 7 on the second type cladding layer 43 and a heat dissipating layered structure 5 on the metal light-enhancing layer 7, followed by removing the sapphire substrate from the buffer layer 22 and forming the first and second electrodes 11, 12 on the buffer layer 22 and the second type cladding layer 43, respectively. In this embodiment, the buffer layer 22 serves as the light-enhancing layer 21 of the light-enhancing layered structure 2. Hence, a planar surface 222 of the buffer layer 22 serves as the planar surface 211 of the light-enhancing layer 21. Moreover, each of the protrusions 221 of the buffer layer 22 protruding from the planar surface 222 of the buffer layer 22 serves as a respective one of the light-enhancing units 3, and has a peripheral wall portion 2201 defining the three inclined faces 31 of the respective one of the light-enhancing units 3. Unlike the recesses 30 in the sapphire substrate in the previous embodiments, which function to enhance the internal reflection, the protrusions 221 of the buffer layer 22 in this embodiment function to enhance light scattering effect.

In this embodiment, each of the protrusions 221 has a tip end 32, and is pyramidal in shape.

Figure 11:
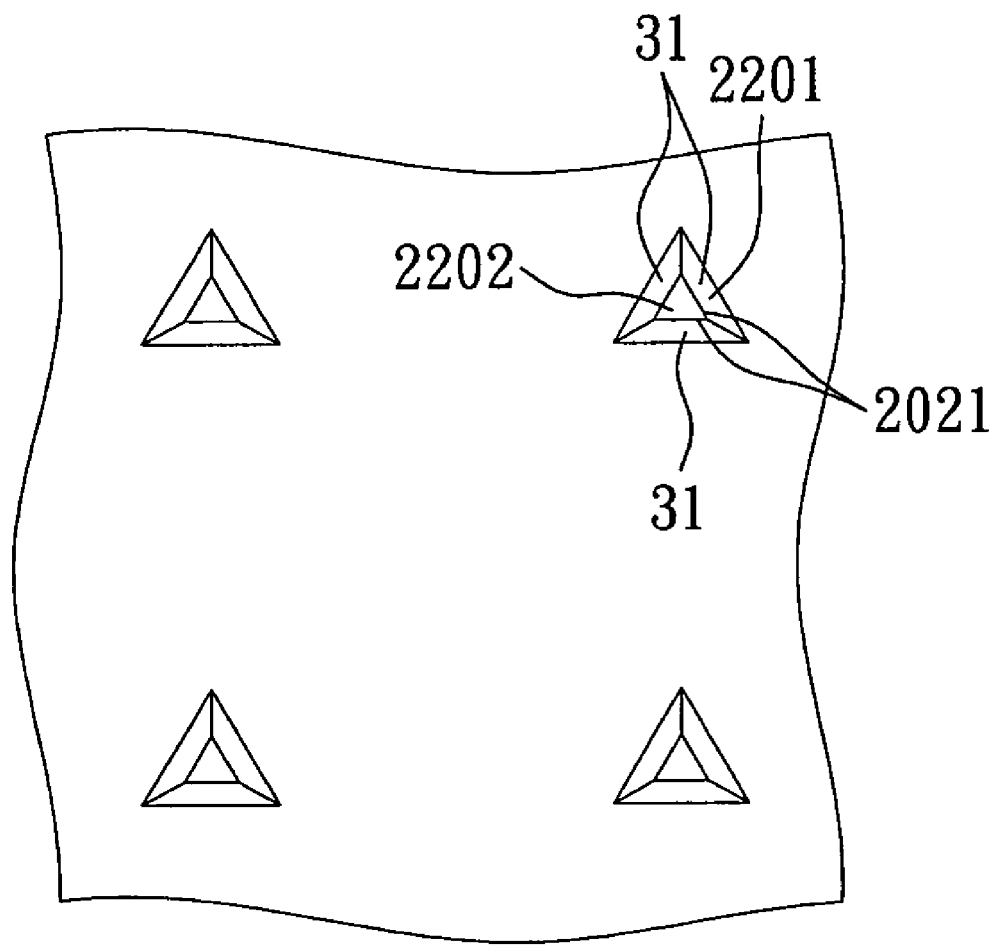

FIG. 11 illustrates the seventh preferred embodiment of the light emitting device according to this invention. The light emitting device of the seventh preferred embodiment differs from the sixth preferred embodiment in that each of the protrusions 221 of the buffer layer 22 further has a base wall portion 2202 that is triangular in shape, and that has three edges 2021 connected respectively to the edges of the inclined faces 31.

Figure 12:
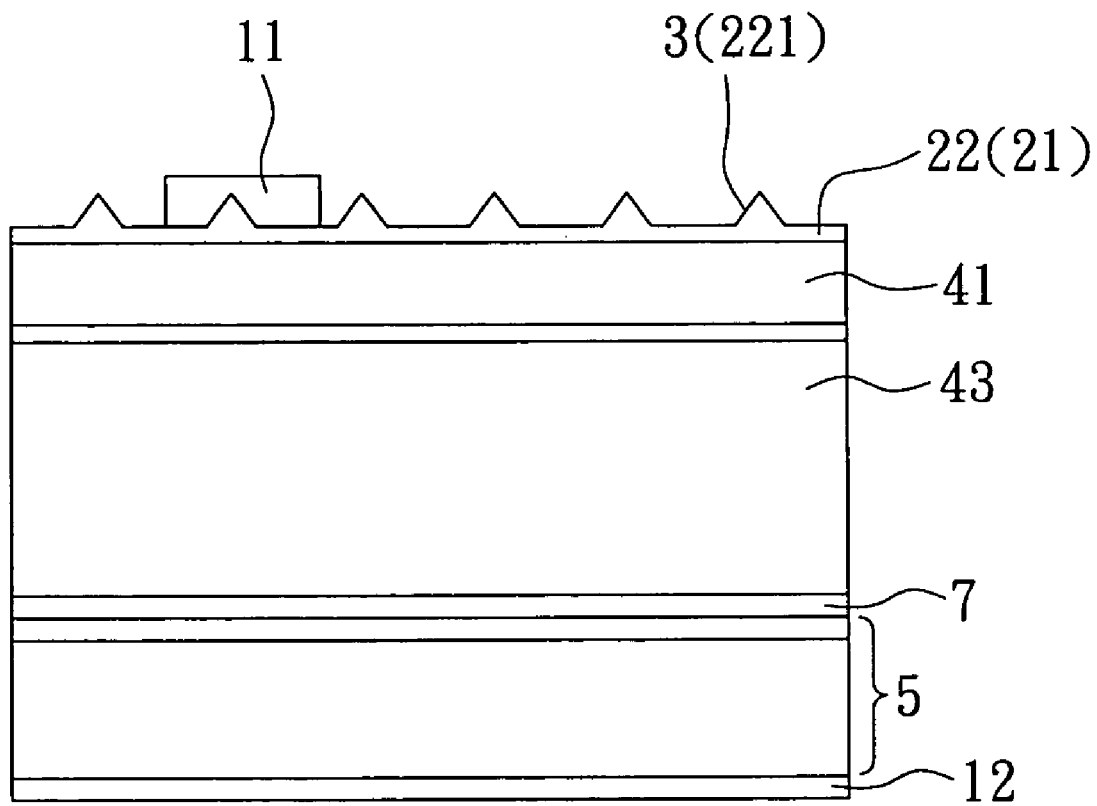

FIG. 12 illustrates the eighth preferred embodiment of the light emitting device according to this invention. The light emitting device of the eighth preferred embodiment differs from the sixth preferred embodiment in that the second electrode 12 is formed on the heat dissipating layered structure 5.

The following examples illustrate how the light emitting device of this invention is formed.

EXAMPLE 1

The light emitting device of this Example is a type of the second preferred embodiment (see FIGS. 4 and 5), and was prepared by the following steps.

A silicon dioxide ($SiO_2$) layer was formed on a sapphire substrate 20 which was to be processed to form the light-enhancing layer 21, and was patterned to form an array of circular holes therein using photolithography techniques. Each of the circular holes thus formed had a diameter of about 3 μm. Etching regions of the sapphire substrate that are exposed from the circular holes in the patterned silicon dioxide layer were etched using an etchant formed by mixing 100 ml of 98 vol % $H_2SO_4$ and 50 ml of 85 vol % $H_3PO_4$ under an etching temperature of 260° C. Recesses 30 with the shape shown in FIGS. 4 and 5 and with a depth of 0.5 μm were formed in the etching regions of the sapphire substrate 20 after the etching process was completed. The buffer layer 22 of doped GaN, the first type cladding layer 41 of n-GaN, the active layer 42 of GaN-based MQW, and the second type cladding layer 43 of p-GaN were subsequently formed on the patterned sapphire substrate 20 in sequence by lateral epitaxial growth techniques so as to form an epitaxial layered structure on the patterned sapphire substrate 20. The first and second electrodes 11, 12 were then formed on the first and second type cladding layers 41, 43. The refractive index and layer thickness of each layer of the layered structure of the light emitting device were measured, and were found to be 1.76 and 100 μm for the sapphire substrate 20, 2.42 and 3 μm for the first type cladding layer 41, 2.54 and 0.3 μm for the active layer 42, and 2.45 and 0.4 μm for the second type cladding layer 43. The light emitting device thus formed is a front surface-emitting-type light emitting diode, i.e., light generated from the active layer 42 is allowed to emit from one side of the epitaxial layered structure opposite to the sapphire substrate 20.

Note that addition of the 85 vol % $H_3PO_4$ in the etchant can inhibit formation of $Al_2(SO_4)_3.17H_2O$ which has an adverse effect on the performance of the thus formed light emitting device.

EXAMPLE 2

The light emitting device of this Example is a type of the fourth preferred embodiment (see FIG. 7). Preparation of the Light Emitting Device of this Example is similar to that of Example 1. The recesses 30 formed in the sapphire substrate 20 of this Example have a depth of 1.0 μm.

EXAMPLE 3

The light emitting device of this Example is a type of the third preferred embodiment (see FIG. 6). Preparation of the light emitting device of this Example is similar to that of Example 1. The recesses 30 formed in the sapphire substrate 20 of this Example have a depth of 1.5 μm.

EXAMPLE 4

The light emitting device of this Example is a type of the third preferred embodiment (see FIG. 6). Preparation of the light emitting device of this Example is similar to that of Example 1. The recesses 30 formed in the sapphire substrate 20 of this Example have a depth of 2.0 μm.

EXAMPLE 5

The light emitting device of this Example is a type of the fifth preferred embodiment (see FIG. 8). Preparation of the light emitting device of this Example is similar to that of Example 1. The light emitting device thus formed is a back surface-emitting-type light emitting diode, i.e., light generated from the active layer 42 is allowed to emit from one side of the sapphire substrate 20 opposite to the epitaxial layered structure.

EXAMPLE 6

The light emitting device of this Example is a type of the sixth preferred embodiment (see FIG. 9). The light emitting device of this Example was prepared by forming the epitaxial layered structure of Example 1 on the sapphire substrate 20, followed by forming the metal light-enhancing layer 7 of Ag/Ti on the epitaxial layered structure, wafer bonding the heat dissipating layered structure 5 of Si—Al/Ti/Au to the metal light-enhancing layer 7, removing the sapphire substrate 20 from the buffer layer 22 using laser lift-off techniques, and forming the first and second electrodes 11, 12. The buffer layer 22 thus formed serves as the light-enhancing layer 21 of the light-enhancing layered structure 2.

Figure 13:
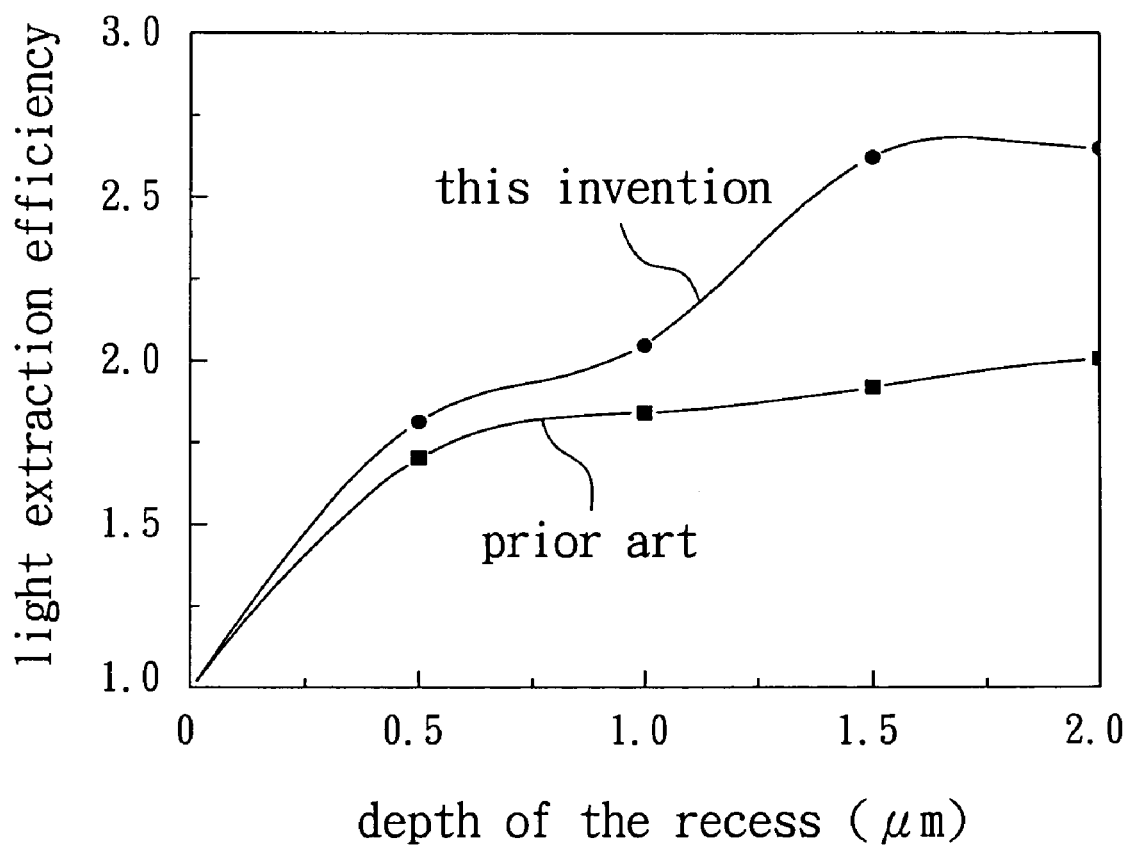

FIG. 13 illustrates the comparison in light extraction efficiency between the light emitting device of this invention and the conventional light emitting device formed through dry etching techniques. The data points of the curve of this invention shown in FIG. 13 represent the light extraction efficiencies of Examples 1 to 4, respectively. The results show that the light emitting device of this invention has a higher light extraction efficiency than that of the conventional light emitting device.

In addition, the light emitting device obtained in Example 6 (in which the sapphire substrate 20 is removed and the buffer layer 22 serves as the light-enhancing layer 21) can achieve a maximum candela of 3.75 mW/sr as compared to 1.8 mW/sr for the conventional light emitting device.

By forming the inclined faces 31 of the recessed wall of each recess to extend in directions parallel to the planes of one of the two subgroups of the crystal planes $\{11\overline{2}\,\overline{k}\}$ of the hexagonal crystal system, the light extraction efficiency of the light emitting device of this invention can be further enhanced as compared to the conventional light emitting devices.

While the present invention has been described in connection with what is considered the most practical and preferred embodiments, it is understood that this invention is not limited to the disclosed embodiments but is intended to cover various arrangements included within the spirit and scope of the broadest interpretation and equivalent arrangements.

What is claimed is:

1. A light emitting device, comprising:
a light-enhancing layered structure of a hexagonal crystal system, said light-enhancing layered structure including a light-enhancing layer having a planar surface that is formed with a plurality of light-enhancing units thereon, each of said light-enhancing units extending in a normal direction relative to said planar surface, being tapered from said planar surface, and having three inclined faces that are adjoined side-by-side and that are respectively parallel to corresponding symmetrical ones of the crystal planes $\{11\overline{2}\,\overline{k}\}$ of the hexagonal crystal system, where $\overline{k}$=2 to 5; and
a light emitting layered structure formed on said light-enhancing layered structure;
wherein each of said light-enhancing units is in the form of a recessed wall that defines a recess indented inwardly from said planar surface of said light-enhancing layer, and that has a peripheral wall portion defining said inclined faces;
wherein said light-enhancing layered structure further includes a buffer layer formed on said planar surface of said light-enhancing layer and formed with a plurality of protrusions extending respectively into said recesses of said light-enhancing units; and
wherein each of said protrusions intersects said inclined faces of said recessed wall of the respective one of said light-enhancing units so as to form closed cavities therebetween.

2. The light emitting device of claim 1, wherein said recessed wall of each of said light-enhancing units has a tip end.

3. The light emitting device of claim 1, wherein said recessed wall of each of said light-enhancing units further has a base wall portion that is triangular in shape, and that has three edges connected respectively to edges of said inclined faces.

4. The light emitting device of claim 1, wherein said recess has a depth ranging from 0.3 to 5 μm relative to said planar surface of said light-enhancing layer.

5. The light emitting device of claim 1, wherein said light-enhancing layer is a sapphire substrate.

6. A light emitting device of comprising:
a light-enhancing layered structure of a hexagonal crystal system, said light-enhancing layered structure including a light-enhancing layer having a planar surface that is formed with a plurality of light-enhancing units thereon, each of said light-enhancing units extending in a normal direction relative to said planar surface, being tapered from said planar surface, and having three inclined faces that are adjoined side-by-side and that are respectively parallel to corresponding symmetrical ones of the crystal planes $\{11\bar{2}\,\bar{k}\}$ of the hexagonal crystal system, where $\bar{k}=2$ to 5; and a light emitting layered structure formed on an opposite surface of said light-enhancing layer opposite to said planar surface of said light-enhancing layer;

wherein each of said light-enhancing units is in the form of a protrusion protruding from said planar surface of said light-enhancing layer and having a peripheral wall defining said inclined and faces; and wherein said light-enhancing units are exposed from said light-enhancing layer and said light emitting layered structure.

7. The light emitting device of claim 6, wherein said protrusion of each of said light-enhancing units has a tip end.

8. The light emitting device of claim 6, wherein said protrusion of each of said light-enhancing units further has a base wall portion that is triangular in shape, and that has three edges connected respectively to edges of said inclined faces.

* * * * *